United States Patent
Andideh et al.

[11] Patent Number: 6,121,100
[45] Date of Patent: Sep. 19, 2000

[54] METHOD OF FABRICATING A MOS TRANSISTOR WITH A RAISED SOURCE/DRAIN EXTENSION

[75] Inventors: Ebrahim Andideh, Portland; Lawrence Brigham, Beaverton; Robert S. Chau, Beaverton; Tahir Ghani, Beaverton; Chia-Hong Jan, Portland; Justin Sandford, Tualatin; Mitchell C. Taylor, Lake Oswego, all of Oreg.

[73] Assignee: Intel Corporation, Santa Clara, Calif.

[21] Appl. No.: 09/001,337

[22] Filed: Dec. 31, 1997

[51] Int. Cl.[7] ................................................. H01L 21/336
[52] U.S. Cl. ........................ 438/305; 438/231; 438/232; 438/307; 257/336; 257/344
[58] Field of Search .................... 438/230, 231, 438/232, 302, 303, 305, 307, FOR 204; 257/408, 344, 336, 900

[56] References Cited

U.S. PATENT DOCUMENTS

| 5,504,023 | 4/1996 | Hong . | |
|---|---|---|---|
| 5,534,447 | 7/1996 | Hong . | |
| 5,710,450 | 1/1998 | Chau et al. | 257/344 |
| 5,908,313 | 6/1999 | Chau et al. | 438/299 |

*Primary Examiner*—Long Pham
*Attorney, Agent, or Firm*—Blakely, Sokoloff, Taylor & Zafman LLP

[57] ABSTRACT

A method of forming a MOS transistor. According to the method of the present invention, a pair of source/drain contact regions are formed on opposite sides of a gate electrode. After forming the pair of source/drain contact regions, semiconductor material is deposited onto opposite sides of the gate electrode. Dopants are then diffused from the semiconductor material into the substrate beneath the gate electrode to form a pair of source/drain extensions.

12 Claims, 7 Drawing Sheets

6,121,100

METHOD OF FABRICATING A MOS TRANSISTOR WITH A RAISED SOURCE/DRAIN EXTENSION

BACKGROUND OF THE INVENTION

1. Field of the Invention

The present invention relates to the field of semiconductor integrated circuits, and more specifically, to the ultra large-scale fabrication of submicron transistors.

2. Discussion of Related Art

Today literally millions of individual transistors are coupled together to form very large-scale integrated (VLSI) circuits, such as microprocessors, memories, and applications specific integrated circuits (ICs). Presently, the most advanced ICs are made up of approximately Five million transistors, such as metal oxide semiconductor (MOS) field effect transistors having gate lengths on the order of 0.35 $\mu$m. In order to continue to increase the complexity and computational power of future integrated circuits, more transistors must be packed into a single IC (i.e., transistor density must increase). Thus, future ultra large-scale integrated (ULSI) circuits will require very short channel transistors with effective gate lengths less than 0.1 $\mu$m. Unfortunately, the structure and method of fabrication of conventional MOS transistors cannot be simply "scaled down" to produce smaller transistors for higher density integration.

The structure of a conventional MOS transistor 100 is shown in FIG. 1. Transistor 100 comprises a gate electrode 102, typically polysilicon, formed on a gate dielectric layer 104 which in turn is formed on a silicon substrate 106. A pair of source/drain extensions or tip regions 110 are formed in the top surface of substrate 106 in alignment with outside edges of gate electrode 102. Tip regions 110 are typically formed by well-known ion implantation techniques and extend beneath gate electrode 102. Formed adjacent to opposite sides of gate electrode 102 and over tip regions 110 are a pair of sidewall spacers 108. A pair of source/drain regions 120 are then formed, by ion implantation, in substrate 106 substantially in alignment with the outside edges of sidewall spacers 108.

As the gate length of transistor 100 is scaled down in order to fabricate a smaller transistor, the depth at which tip region 110 extends into substrate 106 must also be scaled down (i.e., decreased) in order to improve punch-through characteristics of the fabricated transistor. Unfortunately, the length of tip region 110, however, must be larger than 0.07 $\mu$m to insure that the later, heavy dose, deep source/drain implant does not swamp and overwhelm tip region 110. Thus, in the fabrication of a small scale transistor with conventional methods, as shown in FIG. 1, the tip region 110 is both shallow and long. Because tip region 110 is both shallow and long, tip region 110 exhibits substantial parasitic resistance. Parasitic resistance adversely effects (reduces) the transistors drive current.

Thus, what is needed is a novel transistor with a low resistance ultra shallow tip region with a VLSI manufacturable method of fabrication in a CMOS process.

SUMMARY OF THE INVENTION

A method of forming a MOS transistor. According to the method of the present invention, a pair of source/drain contact regions are formed on opposite sides of a gate electrode. After forming the pair of source/drain contact regions, semiconductor material is deposited onto opposite sides of the gate electrode. Dopants are then diffused from the semiconductor material into the substrate beneath the gate electrode to form a pair of source/drain extensions.

BRIEF DESCRIPTION OF THE DRAWINGS

FIG. 3b is an illustration of a cross-sectional view showing the formation of a first pair of sidewall spacers on the substrate of FIG. 3a.

DETAILED DESCRIPTION OF THE PRESENT INVENTION

A novel transistor with a low resistance ultra shallow tip and its method of fabrication is described. In the following description numerous specific details are set forth, such as specific materials, dimensions, and processes, etc., in order to provide a thorough understanding of the present invention. It will be obvious, however, to one skilled in the art, that the invention may be practiced without these specific details. In other instances, well-known semiconductor equipment and processes have not been described in particular detail in order to avoid unnecessarily obscuring the present invention.

Figure 1:
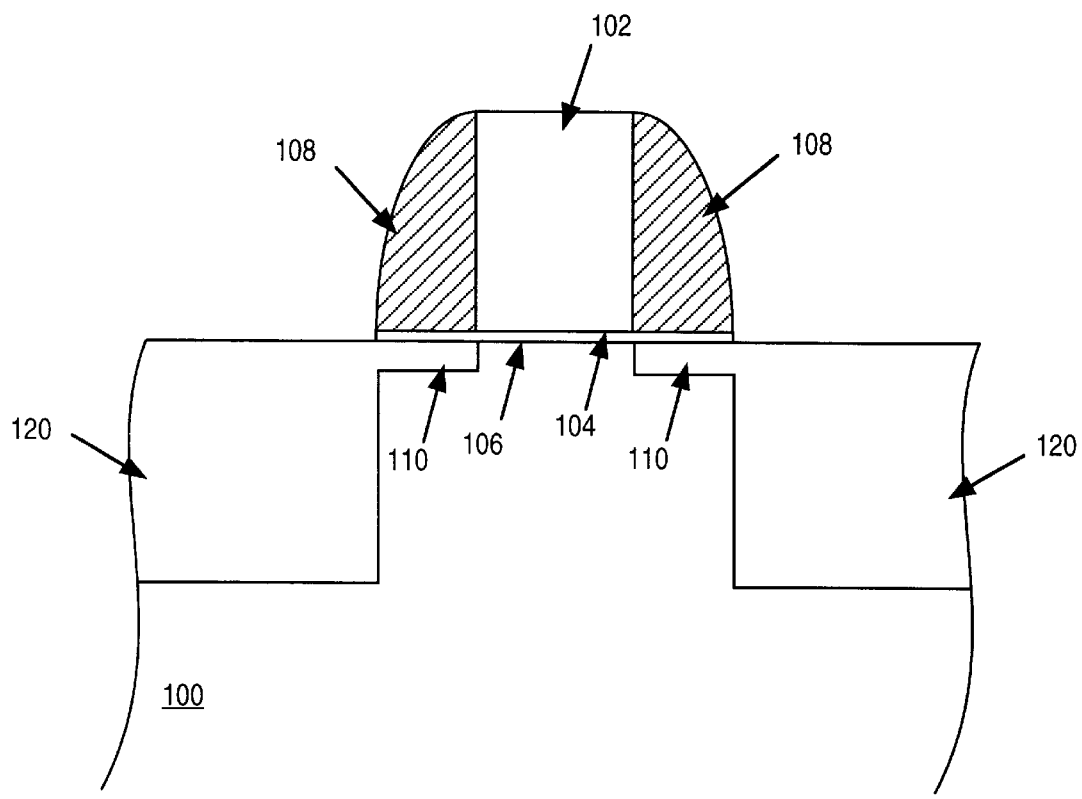
FIG. 1 is an illustration of a cross-sectional view of a conventional metal oxide semiconductor (MOS) transistor.
Figure 2:
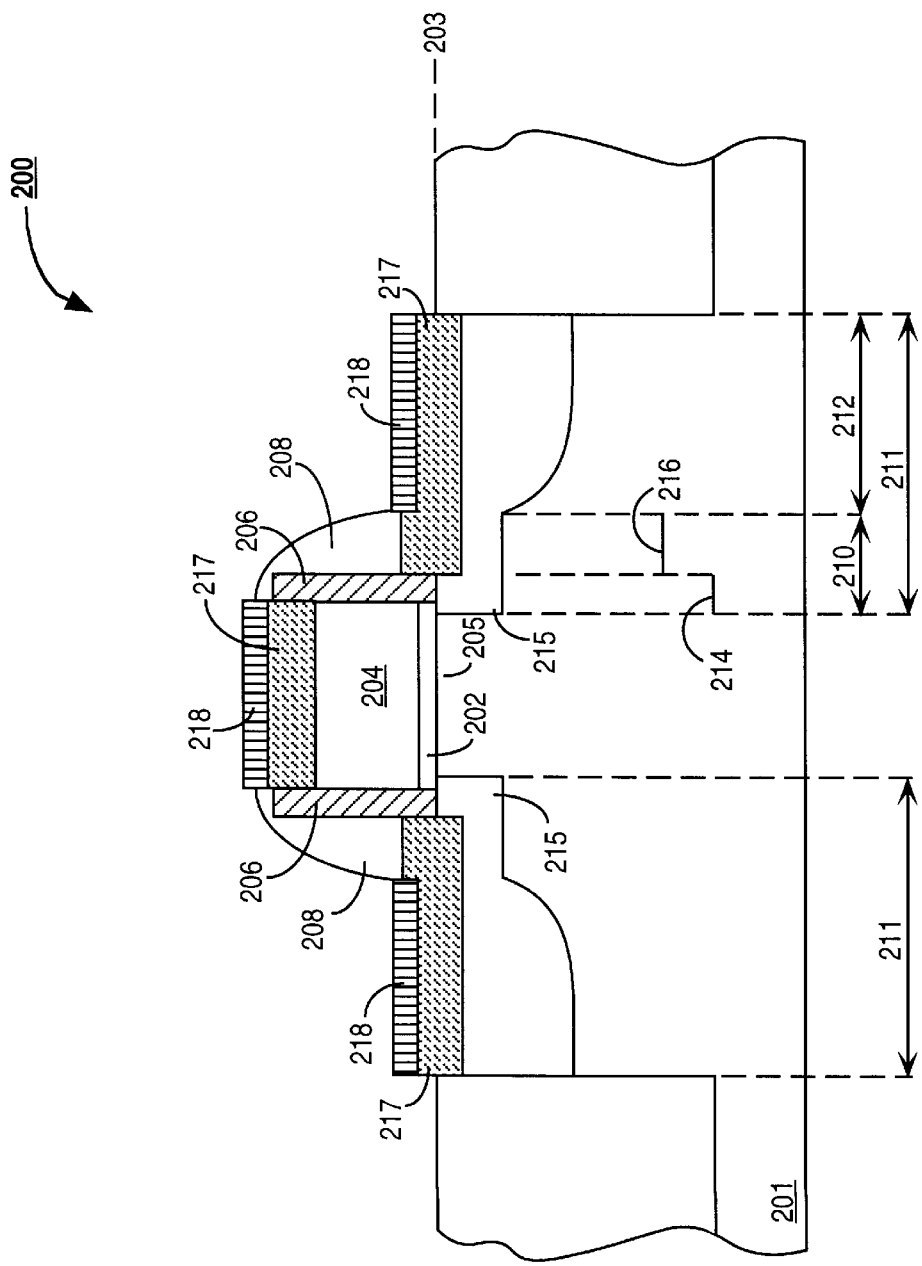
FIG. 2 is an illustration of a cross-sectional view showing an MOS transistor in accordance with the present invention

An embodiment of a novel transistor 200 with a low resistivity, ultra shallow tip in accordance with the present invention is shown in FIG. 2. Transistor 200 is formed on a silicon substrate or well 201. A gate dielectric layer 202 is formed on a surface 203 of substrate 201 and a gate electrode 204 is in turn formed on gate dielectric layer 202. A pair of thin sidewall spacers 206 are formed on opposite sides of gate electrode 204 (spacers 206 run along the "width" of gate electrode 204). Transistor 200 may also include an additional pair of substantially thicker sidewall spacers 208 formed adjacent to the outside edges of the sidewall spacers 206. Transistor 200 includes a pair of source/drain regions 211 each comprising a tip or source/ drain extensions 210 and a source/drain contact region 212. The channel 205 of transistor 200 is located in substrate 201 beneath gate electrode 204 and between the source/drain regions 211.

Tip or source/drain extension 210 is defined as the source/drain region located between source/drain contact regions and the channel 205. Tip 210 comprises an ultra shallow tip portion 214 and a raised tip portion 216. Ultra shallow tip portion 214 is comprised of a doped semiconductor substrate 215 formed by "out diffusing" dopants from selectively deposited semiconductor material 217 into substrate 201. Ultra shallow tip 214 extends from beneath first sidewall spacer 206 to beneath the outside edges of gate electrode 204. Ultra shallow tip 214 preferably extends at least 100 Å beneath (laterally) gate electrode 204 and preferably 500 Å for a transistor with an effective gate length of approximately 0.10 microns (or 1000 Å) and a drawn gate length of 0.2 $\mu$m. Additionally, ultra shallow tip 214 preferably extends less than 1000 Å deep into substrate 201 beneath substrate surface 203 for a 0.10 $\mu$m effective gate length. It is to be appreciated that because novel methods of fabrication are employed in the present invention, ultra shallow tip 214 can be characterized by a very abrupt junction.

Tip 210 of transistor 200 also includes a raised tip portion 216. Raised tip portion 216 is located between ultra shallow tip portion 214 and source/drain contact region 212 and is adjacent to the outside edges of first sidewall spacer 206. Raised tip 216 is preferably formed of selectively deposited doped semiconductor material 217. Raised tip region 216 can be formed above substrate surface 203 by depositing semiconductor material 212 onto surface 203 or can be formed so that it is both above and below substrate surface 203 by forming recesses adjacent to the outside edges of spacers 206 prior to depositing semiconductor material 212. Raised tip portion 216 also includes a portion 215 doped by "out diffusing" dopants from selectively deposited semiconductor material 217 into substrate 201. Because a portion of tip 210 is formed above semiconductor substrate surface 203, tip 210 is said to be "raised". A raised tip significantly reduces the parasitic resistance of transistor 200 and thereby improves its performance.

A pair of source/drain contact regions 212 are located adjacent to the outside edges of tip regions 210. Source/drain contact regions 212 comprise selectively deposited semiconductor material 217 and doped semiconductor substrate 215. Source/drain contact regions 212 are partially raised source/drain contact regions. Silicide 218 is preferably formed on source/drain contact regions 212 in order to reduce the contact resistance of transistor 200. Source/drain contact regions 212 are preferably deep junction source/drain contacts formed by ion implanting or diffusing dopants into a region 220 in substrate 201. Additionally, according to the present invention, first semiconductor material 217 is preferably deposited onto the top surface of gate electrode 204. Silicide 218 is also preferably formed on deposited semiconductor material 217 on gate electrode 204 to help improve contact resistance.

Figure 3A:
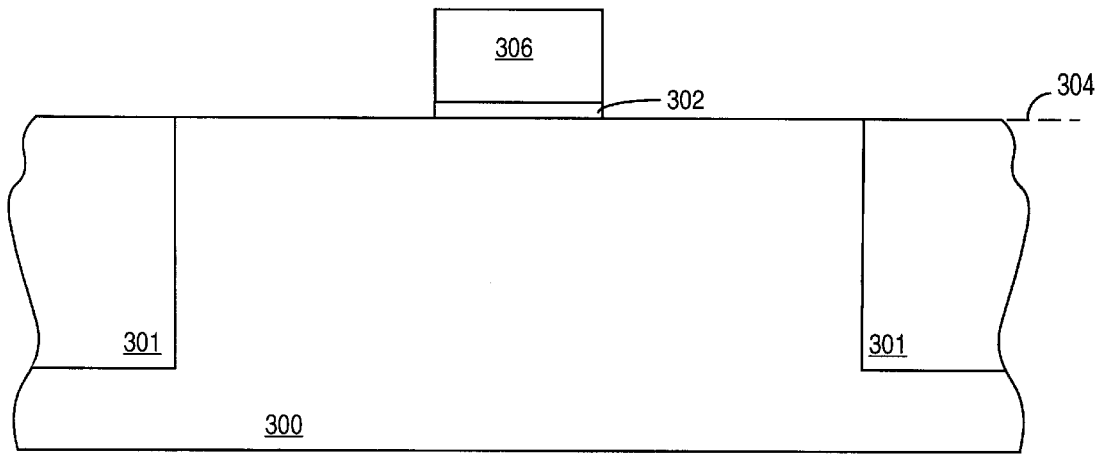
FIG. 3a is an illustration of a cross-sectional view showing the formation of a gate electrode and isolation regions in a semiconductor substrate.

FIGS. 3a–3i illustrate an exemplary method of fabricating a raised tip MOS metal oxide semiconductor (MOS) transistor in accordance with the present invention. The preferred method of fabrication will be described with the respect to the fabrication of a PMOS transistor. It is to be appreciated that the preferred method is equally applicable to the fabrication of NMOS devices wherein the conductivity types are simply reversed. As shown in FIG. 3a, a PMOS transistor of the present invention is preferably fabricated on the N type substrate or well 300 doped to a concentration level between $1 \times 10^{17}/\text{cm}^3$–$1 \times 10^{19}/\text{cm}^3$.

A plurality of field isolation regions 301 are formed in substrate 300 to isolate wells of different conductivity types and to isolate adjacent transistors. Field isolation regions are preferably shallow trench isolation (STI) regions formed by etching a trench into substrate 300 and then filling the trench with a deposited oxide. Although STI isolation regions are preferred because of their ability to be formed to small dimensions with a high degree of planarity, other methods can be used such as, but not limited to, LOCOS, recessed LOCOS, or silicon on insulator (SOI), and suitable insulators, other than oxides, such as nitrides may be used if desired.

According to the preferred embodiment, n-type conductivity substrate 300 is a n-well formed by a first implant of phosphorous atoms at a dose of $4 \times 10^{13}/\text{cm}^2$ and an energy of 475 keV, a second implant of phosphorous atoms at a dose of $2.5 \times 10^{12}/\text{cm}^2$ at an energy of 60 keV, and a final implant of arsenic atoms at a dose of $1 \times 10^{13}/\text{cm}^2$ at an energy of 180 keV into a silicon substrate 300 having a concentration of $1 \times 10^{16}/\text{cm}^3$ in order to produce a n-well 304 having a n-type concentration of approximately $7.0 \times 10^{17}/\text{cm}^3$. (To form a NMOS device, a p-well can be formed by a first implant of boron atoms at a dose of $3.0 \times 10^{13}/\text{cm}^2$ at an energy of 230 keV followed by a second implant of boron ions at a dose of $4.2 \times 10^{13}/\text{cm}^2$ and an energy of 50 keV into a substrate in order to produce a p-well having a p-concentration of $7.0 \times 10^{17}/\text{cm}^3$.) It is to be appreciated that p-type conductivity regions and n-type conductivity regions may be formed by other means including providing an initially doped substrate, or depositing an insitu doped semiconductor material with a desired conductivity. According to the present invention, a substrate is defined as the starting material on which the transistor of the present invention is fabricated.

According to the present invention, first a gate dielectric layer 302 is formed on top surface 304 of substrate 300. Gate dielectric layer 302 is preferably a nitrided oxide layer formed to a thickness of between 10 Å–50 Å. It is to be appreciated that other well known gate dielectrics such as oxides, nitrides, and combinations thereof may be utilized, if desired.

Figure 3B:
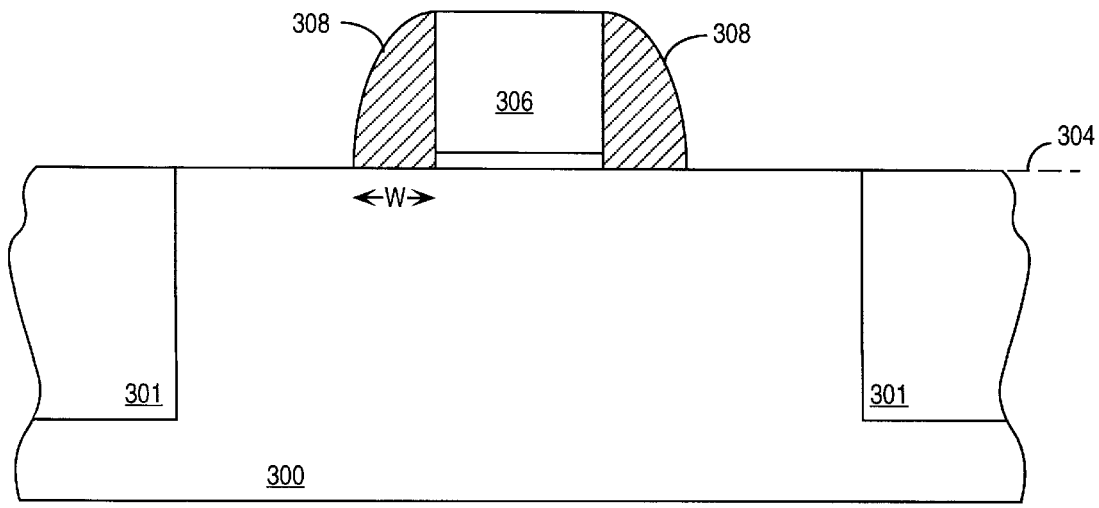

Next, a gate electrode 306 is formed over gate dielectric layer 302 as shown in FIG. 3a. Gate electrode 306 can be formed by blanket depositing a 1000–3000 Å layer of polysilicon onto gate dielectric layer 302. If desired, the polysilicon layer can be ion implanted to the desired conductivity type and level prior to or after patterning. The polysilicon layer is then patterned into a gate electrode 306 with well known photolithographic and etching techniques. It is to appreciated that other well known patterning techniques can be utilized to form gate electrode 306 including submicron photolithography techniques such as e-beam and x-ray, and sublithographic patterning techniques, such as described in U.S. Pat. No. 5,434,093 entitled "Inverted Spacer Transistor", and assigned to the present assignee. According to the presently preferred method of the present invention, gate electrode 306 has a drawn length of approximately 0.2 $\mu$m (i.e., 2000 Å). Additionally, although the electrode 306 is preferably a polysilicon gate electrode, gate electrode 306 can be a metal gate, a single crystalline silicon gate, or any combination thereof, if desired. Next, as shown in FIG. 3b, a first pair of sidewall spacers 308 are formed adjacent to and on laterally opposite sides of gate electrode 306. Sidewall spacers must have a minimum width (W) which is sufficient to offset from the gate electrode a subsequent ion implantation step used to form source/drain contact regions. Sidewall spacers 308 can be formed to a width of between 500–2,500 Å with 1,200 Å being preferred. Any well known method and material may be utilized to form sidewall spacers 308. For example, sidewall spacers 308 can be formed by blanket depositing a 500–2,500 Å thick silicon nitride layer by chemical vapor deposition (CVD) over substrate 300 and then anisotropically etching the silicon nitride layer to form spacers 308. Alternatively, sidewall spacer 308 can be formed by blanket depositing of 500–2,500 Å thick silicon dioxide layer by chemical vapor deposition over substrate 300 and then anisotropically etched to form spacers 308. Additionally, sidewall spacers 308 can be formed from a composite film comprising for example both silicon dioxide and silicon nitride.

Figure 3C:
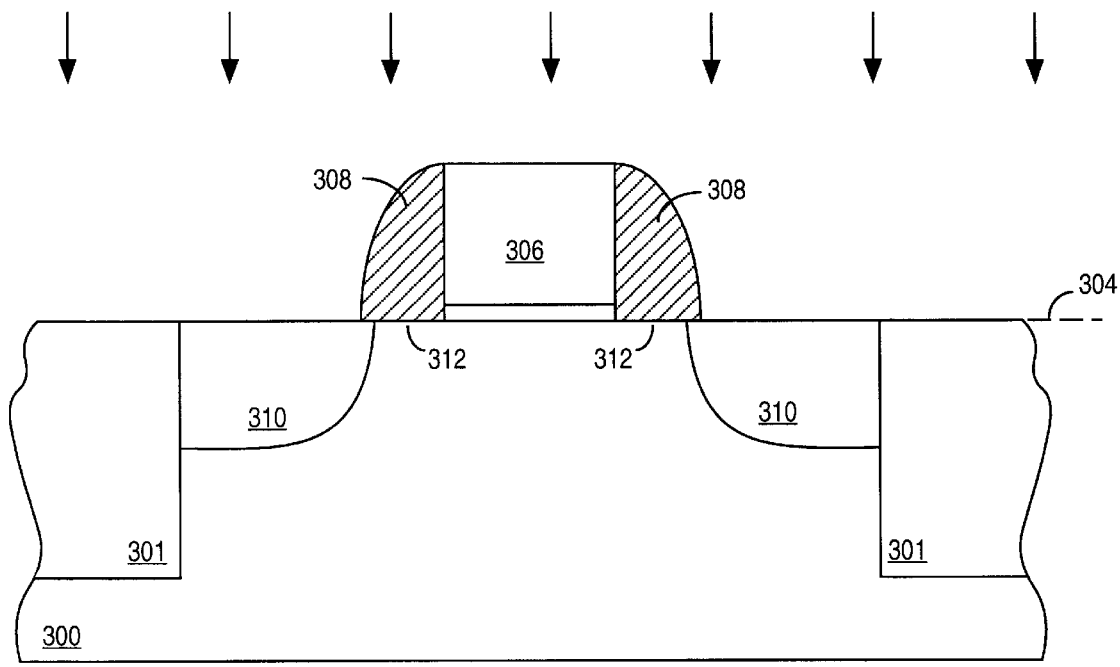
FIG. 3c is an illustration of a cross-sectional view showing the formation of source/drain contact regions in the substrate of FIG. 3b.

Next, as shown in FIG. 3c, a pair of source/drain contact regions 310 are formed into substrate 300. Source/drain contact regions 310 can be formed by well known ion implantation and anneal steps which implant p-type conductivity impurities such as boron, into substrate 300. The ion implantation step preferably forms source/drain contact regions 310 with a p-type conductivity level of between $1 \times 10^{19}/cm^3$ to $5 \times 10^{20}/cm^3$ and the source/drain contact region 310 having a depth of between 0.15–0.25 microns beneath surface 304. (It is to be appreciated that in the case of an NMOS transistor, n-type conductivity dopants such as arsenic or phosphorous would be used.) Additionally, the ion implantation step can also be used to dope polysilicon gate electrode 306, if not previously doped during polysilicon gate electrode formation. It is to be appreciated that the sidewall spacers 308 must be formed thick and wide enough to provide a sufficient mask to prevent the deep high dose ion implantation of the source/drain contact regions 310 from overwhelming or substantially diffusing into the regions 312 beneath spacers 308 which are to subsequently become the source/drain extensions of the transistor. Any well known anneal, such as a rapid thermal anneal in a nitrogen ambient, can be used to drive the implanted impurities to their desired depth.

Figure 3D:
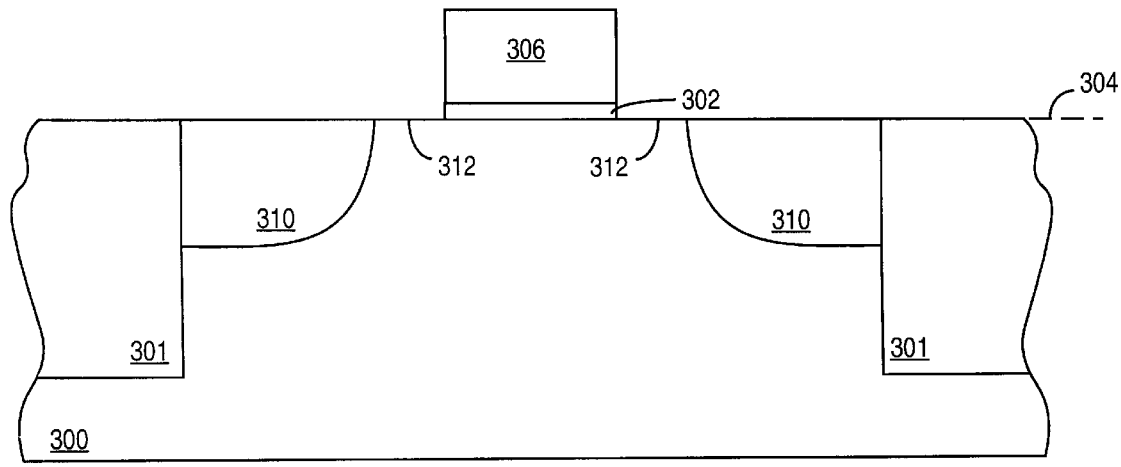
FIG. 3d is an illustration of a cross-sectional view showing the removal of the first pair of sidewall spacers from the substrate of FIG. 3c.

Next, as shown in FIG. 3d, sidewall spacers 308 are removed from substrate 300. Spacers 308 are preferably removed with an etchant which can selectively etch the spacer material with respect to the material used to form the isolation region 301. For example, if spacers 308 are formed from silicon nitride, and isolation regions are filled with silicon dioxide, then the spacers can be removed with a phosphoric acid wet etch. If oxide spacers are desired, then the oxide material used for the spacers can be doped with impurities such as phosphorous so that it can be selectively etched with respect to an undoped oxide formed in the STI region. It is to be appreciated that a selective etch is desirable so that the field isolation regions are not substantially etched during the spacer removal step so that their isolation properties are not degraded.

Figure 3E:
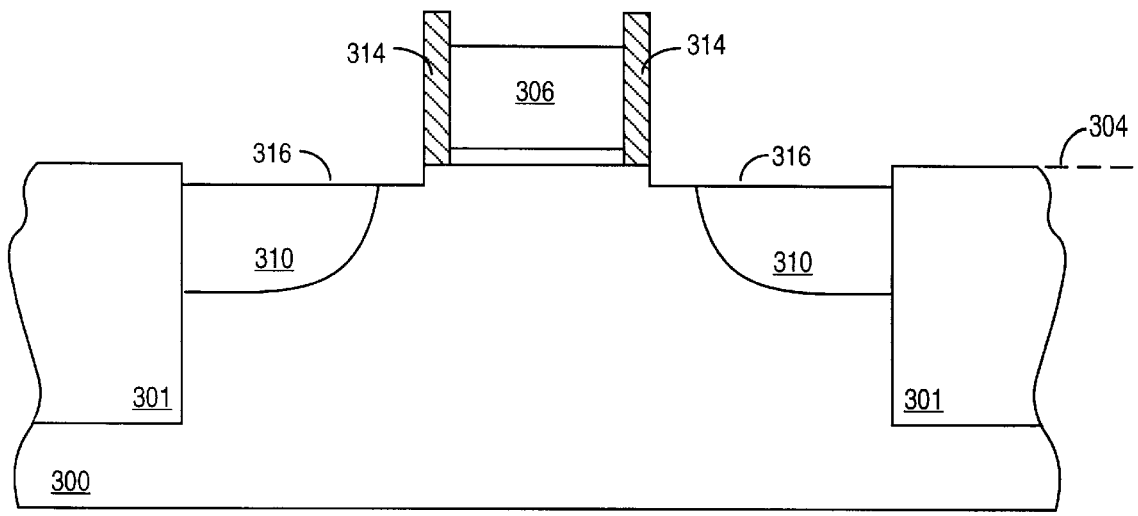
FIG. 3e is an illustration of a cross-sectional view showing the formation of a second pair of sidewall spacers on the substrate of FIG. 3d.

Next, as shown in FIG. 3e, a pair of sidewall spacers 314 are formed along and adjacent to opposite sidewalls of gate electrode 306. Spacers 314 are preferably silicon nitride spacers formed by anisotropically etching a blanket deposited silicon nitride layer. The silicon nitride layer is formed to a thickness of between 50 Å–500 Å with approximately 150 Å being preferred. It is to be appreciated that the silicon nitride layer must be formed thick enough to electrically isolate a subsequently deposited semiconductor material from gate electrode 306. Additionally it is to be appreciated that the thickness of the deposited silicon nitride layer defines the width of spacer 308 and thus the minimum length of the ultra shallow tip portion of the fabricated transistor. Silicon nitride spacers 314 are preferably formed from a silicon nitride layer formed by a "hot wall" process to provide a very hermetic seal of gate electrode 306 and the etches of gate dielectric layer 302. By forming a silicon nitride layer directly onto gate electrode 306, a hermetic seal is formed and thus the hot electron lifetime of the fabricated transistor is dramatically improved.

It is to be appreciated that a native monolayer of an oxide can incidentally form on gate electrode 306 prior to silicon nitride deposition. (Such a monolayer of oxide does not affect the integrity of the hermetic seal and it is considered unimportant to the present invention.) Additionally, although a hot wall silicon nitride layer is preferred in the present invention because of the hermetic seal it forms, any suitable insulating layer such as a deposited oxide can be used to form sidewall spacers 314.

A silicon nitride layer can be formed by a low pressure chemical vapor deposition (LPCVD) process by reacting ammonia (NH3) and dichlorosilane (DCS) at a pressure of approximately 10 pascals and a temperature of approximately 800° C. Additionally silicon nitride spacers 314 can be formed by anisoptropically etching a silicon nitride layer by reactive ion etching (RIE) utilizing a chemistry comprising $C_2F_6$ and a power of approximately 200 watts.

If desired, the anisotropic etch can be continued to form a pair of recesses 316 on opposite sides of gate electrode 306. It is to be appreciated that if an anisotropic etch is utilized the recess etch of the present invention will be self aligned to the outside edges of the silicon nitride spacers 314. Substrate 300 can be etched to form recesses 316 with a depth of approximately 20 Å–1,000 Å with a depth of 100 Å below substrate surface 304 being preferred. It is to be appreciated that the depth of recesses 316 defines a minimum depth at which the fabricated transistors ultra shallow tips will extend into substrate 300. The deeper the recesses 316, the deeper the PMOS transistors tip regions will extend to substrate 300. Although the formation of recesses 316 is not necessary to practice the present invention, they are desirable because they enable the formation of very abrupt tip regions as will be described later.

Figure 3F:
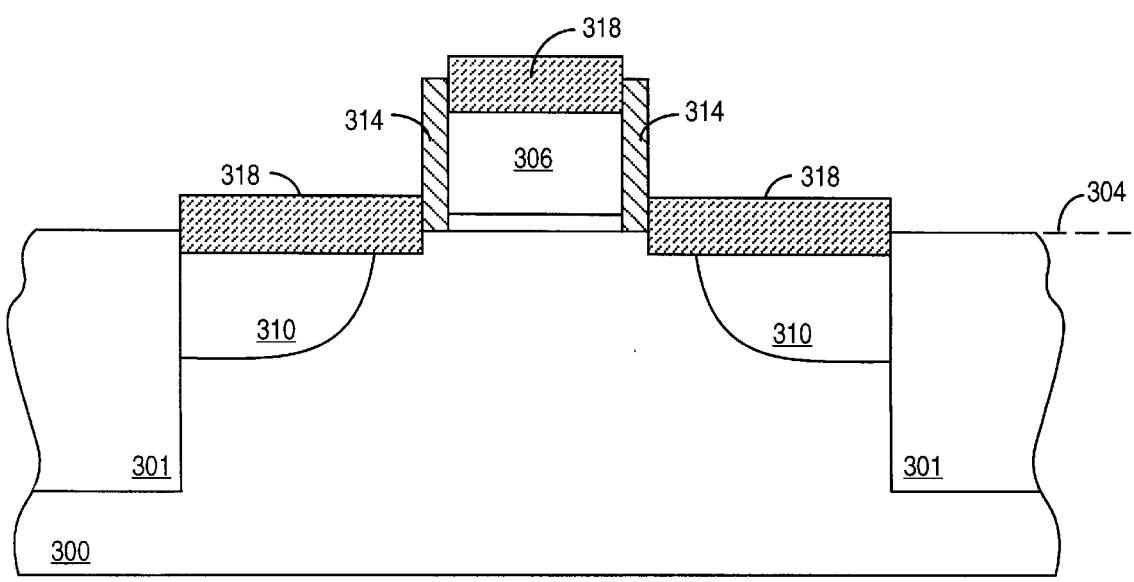
FIG. 3f is an illustration of a cross-sectional view showing the deposition of semiconductor material on the substrate of FIG. 3e.

Next, according to the preferred embodiment of the present invention as shown in FIG. 3f, semiconductor material 318 is selectively deposited into recesses 316 and onto the top surface of gate electrode 306. (If recesses 316 are not formed, then semiconductor material 318 is deposited onto surface 304 of substrate 300 adjacent sidewall spacers 314.) Semiconductor material 318 is selectively deposited so that it forms only on exposed silicon such a substrate 300, and polysilicon gate electrode 306. No semiconductor material is formed on sidewall spacer 308 or on isolation region 301. That is, semiconductor material will only form where silicon atoms available to act as "seed" layer for the selective silicon deposition process.

Sidewall spacers 314 electrically isolate semiconductor material 318 formed in recesses 316 from gate electrode 306. Semiconductor material 318 is preferably formed to a thickness sufficient to form semiconductor material above surface 304 of semiconductor substrate 300. Semiconductor material 318 is preferably formed to a thickness of between 100 Å–2000 Å with 800 Å being preferred. Additionally, in the case of a PMOS transistor semiconductor material 318 is doped with p-type impurities, such as boron, to a concentration level of between $1 \times 10^{10}/cm^3$ to $5 \times 10^{20}/cm^3$ with a concentration of approximately $1 \times 10^{20}/cm^3$ being preferred. Semiconductor material 318 can be insitu doped with p-type impurities during the deposition.

Figure 3G:
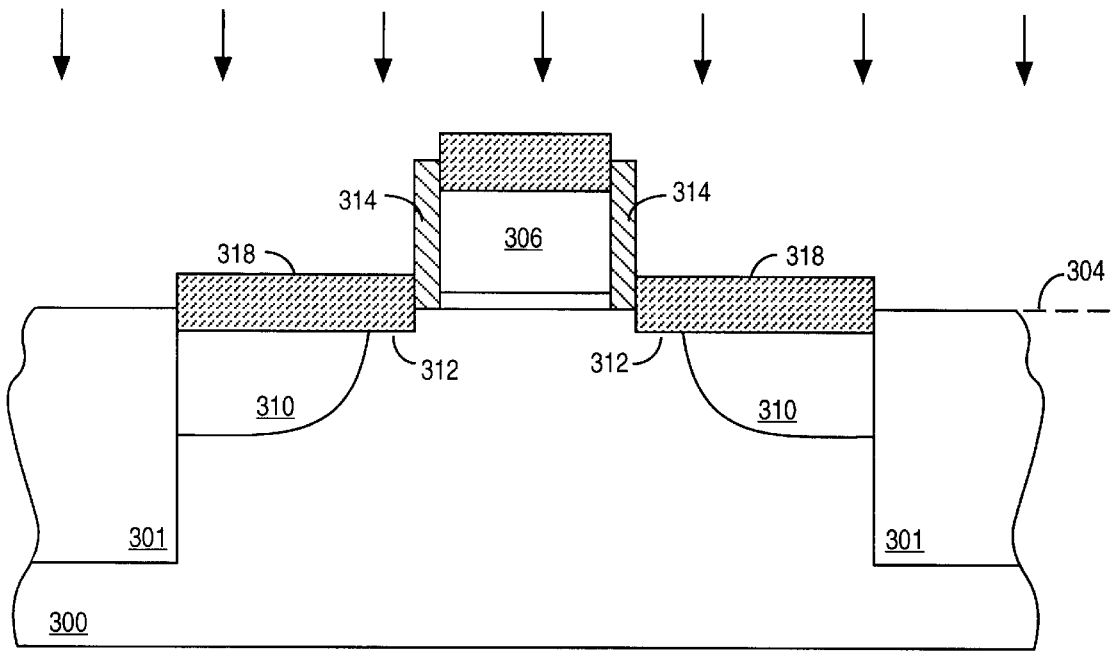
FIG. 3g is an illustration of a cross-sectional view showing the doping of the deposited semiconductor material on the substrate of FIG. 3f.

Alternatively, as shown in FIG. 3g semiconductor material 318 may be doped to the desired conductivity level after deposition by ion implantation or diffusion. For example, in the fabrication of the CMOS or BiCMOS parts it may be necessary to dope semiconductor material 318 after deposition so that standard photoresist masking techniques can be used to form both p-type conductivities semiconductor materials and n-type conductivity semiconductor material for the PMOS and NMOS type devices, respectively, of a CMOS circuit. If semiconductor material 318 is doped by ion implantation the implant energy should be sufficiently low so that the implant dose is confined within semiconductor material 318 (i.e., so that a significant amount of the dose does not get into region 312 of substrate 300).

According to the present invention, semiconductor material 318 is preferably a silicon/germanium semiconductor alloy with germanium comprising approximately 1–50% of the alloy with 25% being preferred. A silicon/germanium semiconductor alloy can be formed by decomposition of $SiH_2Cl_2$ and $GeH_4$ in $H_2$ ambient, at a temperature of between 500–800° C., with 700° C. being preferred. Such a semiconductor material is preferred because it exhibits good selectivity to silicon during deposition, making the present invention very manufacturable. Additionally, such a silicon/germanium semiconductor alloy exhibits many "faults" or "dislocations" which aid in the solid state diffusion of dopants through the semiconductor material. Still further, silicon/germanium semiconductor can be deposited at a relatively low temperature, thereby reducing the thermal budget of the present invention.

It is to be appreciated that any semiconductor material which can be selectively deposited can be used to form semiconductor material 318. For example, semiconductor material 318 can be selectively deposited polycrystalline silicon formed from $SiH_2Cl_2$ and HCl in a $H_2$ ambient, at temperature of between 600–900° C., or can be selectively deposited single crystalline silicon formed by any well-known technique. Prior to selective deposition of semiconductor material 318, one can utilize a 600°–1100° C. bake in a $H_2$ ambient to remove native oxides from exposed silicon/polysilicon areas.

Figure 3H:
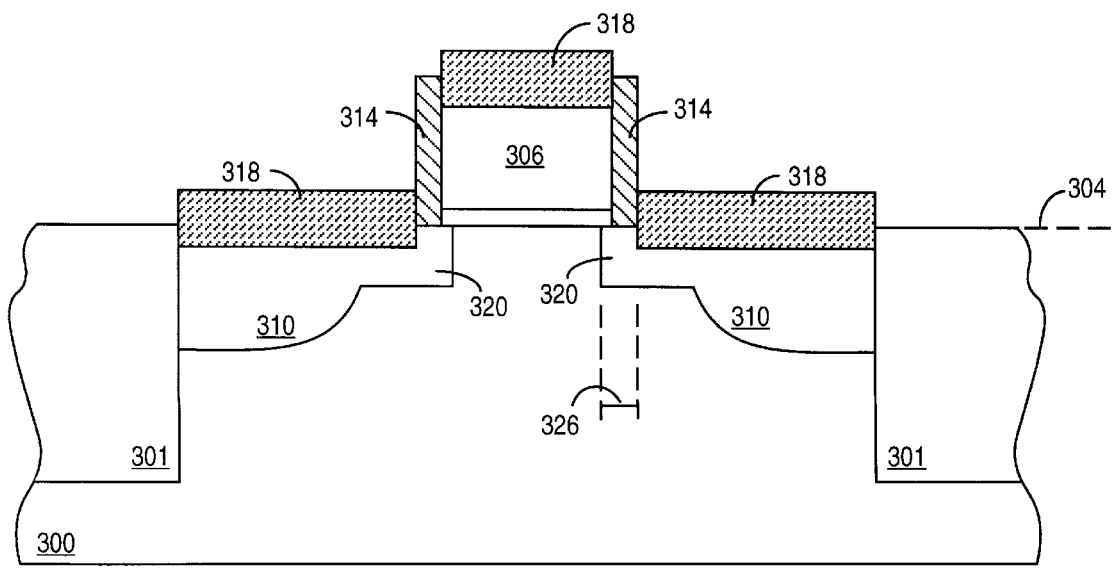
FIG. 3h is an illustration of a cross-sectional view showing the out diffusion of dopants from the deposited semiconductor material of FIG. 3g to form a pair of source/drain extensions.

Next, as shown in FIG. 3h, substrate 300 is annealed to diffuse p-type impurities or dopants out from semiconductor material 318 and into substrate 300 to form diffused semiconductor regions 320. The diffusion of impurities from semiconductor material 318 forms diffused semiconductor regions 320 with a concentration level approximately equal to the deposited semiconductor 318. Impurities are diffused laterally (horizontally) beneath the first thin silicon nitride spacers 314 until impurities extend at least 100 Å (laterally) beneath the outside edges of gate electrode 306, and preferably extend 300 Å (laterally) beneath gate electrode 308. Diffused semiconductor regions 320, which laterally extend between the pair of silicon nitride spacers 314 and gate electrode 306, is the ultra shallow tip 326 of the MOS transistor. It is to be appreciated that the outdiffusion of impurities also diffuses impurities deeper (i.e., vertically) into substrate 500. For each 150 Å of lateral diffusion dopants diffuse about 150 Å vertically into substrate 500. Thus, according to the preferred embodiment of the present invention, ultra shallow tips 326 are approximately 650 Å in length and approximately 850 Å deep to provide an approximately 0.1 micron effective gate length for a drawn gate electrode length of approximately 2000 Å (0.2 microns).

According to the preferred embodiment of the present invention, an anneal using a rapid thermal process (RTP) is utilized to diffuse impurities from semiconductor material 318 into substrate 300 and form diffusion doped semiconductor regions 320. According to the preferred RTP of the present invention, a two step rapid thermal annealing is used. In the first step, substrate 500 is heated to a temperature of approximately 500°–900° C. with 600° C. preferred in an ambient comprising 5–20% $O_2$ with 10% $O_2$ being preferred, and 95–80% $N_2$ with 90% $N_2$ preferred, for approximately 20–60 seconds with 30 seconds being preferred. Because oxygen is included in the ambient during the first step of the RTP, a thin oxide capping layer (not shown) is formed on semiconductor material 318. The thin oxide capping layer prevents dopant loss (i.e., outdiffusion of dopants into the ambient) during the anneal. In this way, the doping concentration of the source/drain regions can be accordingly controlled and low parasitic resistance regions formed. Additionally, it is to be noted that the first RTP step also forms a thin capping layer on the semiconductor material 318 on gate electrode 306, which prevents dose loss and resultant poly depletion effects in the fabricated transistor.

Figure 3I:
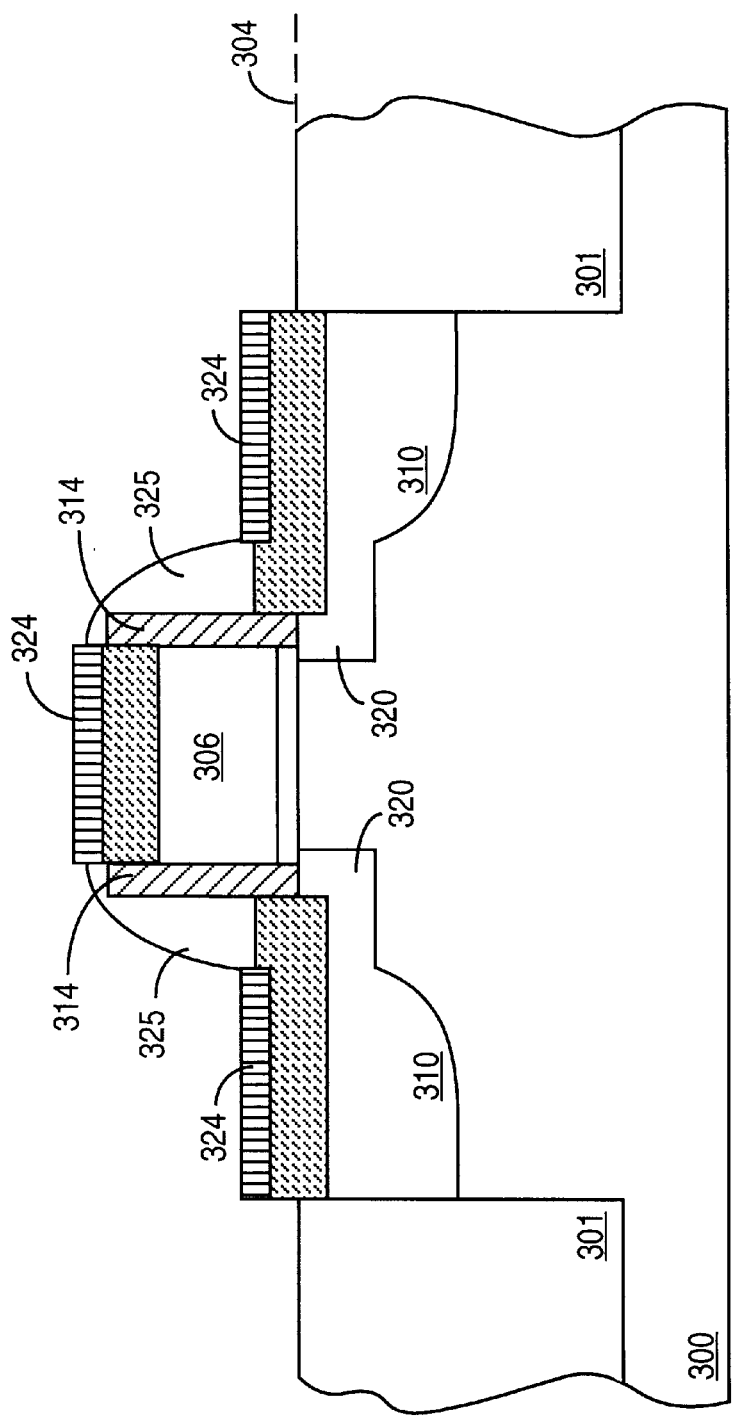
FIG. 3i is an illustration of a cross-sectional view showing the formation of spacers and silicide on the substrate of FIG. 3g.

After completion of the first step of the RTP anneal, the ambient is changed to 100% $N_2$ and annealing continued for an additional 5–300 seconds with 20 seconds preferred at a temperature in the range of 900°–1100° C. with 1050° C. being preferred. The second step of the RTP causes the diffusion of impurities from semiconductor material 318 into substrate 300 and the resultant formation of ultra shallow tip 326. It is to be appreciated that the two steps of the RTP anneal of the present invention preferably occur insitu (i.e., the second anneal step is done serially and in the same chamber as the first anneal step). Additionally, any well known rapid thermal annealing equipment such as, but not limited to, an AG Associates rapid thermal processor can be utilized to conduct the RTP anneal of the present invention. If desired, silicide 324 can be formed onto semiconductor material 318, as shown in FIG. 3i, to decrease the contact resistance of the device and thereby improve performance. Any well known method can be utilized to form silicide region 324 such as a self aligned silicide (salicide) processes. In such a process a third pair of sidewall spacers 325 having a thickness of between 500 Å–2000 Å can be formed to prevent silicide encroachment and the shorting of gate electrode 306 to the source/drain regions. It is to be appreciated that sidewall spacer 314 may be formed thick enough and robust enough to not require the utilization of an additional pair of sidewall spacers 325. However, the thickness of first sidewall spacer 314 should be kept sufficiently thin in order to provide an ultra shallow and abrupt tip region 320. Additionally, the anneal utilized to diffuse impurities from semiconductor material 318 and to form the capping dielectric layer may be deferred until the silicide anneal step (if utilized) in order to keep the thermal budget low and controllable.

A valuable feature of the present invention is that the source/drain contact regions 310 are formed prior to the formation of the source/drain extensions by out diffusion of dopant from semiconductor material 318. Because source/drain contact regions 310 are formed prior to the formation of the source/drain extension, the heavy dose ion implantation step and anneal used to form the source/drain contact regions does not swarm or overwhelm the source/drain extensions region. Additionally, by forming the source/drain contact regions 310 prior to the formation of the source/drain extensions, high temperature steps used to form the first or second pair of sidewall spacers will not cause further diffusion of the extensions which enables their placement to be precisely controlled. Still another advantage resulting from the formation of a source/drain contact regions prior to the formation of the extensions is that deep junction source/ drain contact regions 310 can be formed utilizing a relatively low energy implant because the source/drain contact implant is made before the deposition of semiconductor material and therefore a high energy implant is not needed to penetrate the deposited semiconductor material. In this way, short and shallow source/drain extensions can be reliably and repeatedly fabricated across a wafer and from wafer to wafer. The process of the present invention enables the further reduction of device dimensions of transistors.

Another valuable feature of an embodiment of the present invention is the fact that semiconductor material 318 can be formed beneath semiconductor substrate surface 304. That is, in an embodiment of the present invention a source of dopants is placed into substrate 300 directly adjacent to the location where the ultra shallow tip is to be formed. In the way, during solid state diffusion step, dopants are able to easily diffuse from semiconductor material 318 in a single direction (laterally) below the first silicon nitride spacers 314 and underneath the outside edge of polysilicon gate electrode 306. This results in an ultra shallow tip 326 which is characterized by a very abrupt and sharp junction with substrate 300. Such an abrupt junction improves the punch-through characteristics of the fabricated PMOS transistor. Additionally, it is to be appreciated that by forming ultra shallow tips 326 by solid state diffusion, higher conductivity tips can be fabricated, then possible, with the standard ion implantation techniques. High concentration tip region improves the device performance and lowers a parasitic resistance over the device.

Alternative embodiments and specifics of the present invention have been described, however, one skilled in the art will appreciate that many of the features in one embodiment are equally applicable to the other embodiment. Additionally, although many specific dimensions, materials, process parameters and concentrations have been described, it is to be appreciated that these specific dimensions, materials, concentrations and processes are not to be taken as limiting. Additionally, one skilled in the art will appreciate the ability to scale the transistor of the present invention to form both larger and smaller devices. The scope of the present invention is not intended to be limited to the detailed description of the present invention and rather is to be determined by the claims which follow.

Thus, a novel transistor with a low resistance ultra shallow tip region with a VLSI manufacturing method of fabrication has been described.

We claim:

1. A method of forming a transistor comprising:

forming a gate electrode on a gate dielectric layer on a first surface of a semiconductor substrate;

forming a first pair of sidewall spacers on opposite sides of said gate electrode;

forming a first pair of source/drain contact regions adjacent to said first pair of sidewall spacers;

removing said first pair of sidewall spacers;

forming a second pair of sidewall spacers on opposite sides of said gate electrode;

depositing semiconductor material on said semiconductor substrate adjacent to said second pair of sidewall spacers; and diffusing dopants from said deposited semiconductor material into said substrate beneath said gate electrode to form a pair of source/drain extensions.

2. The method of claim 1 further comprising forming silicide on said semiconductor material.

3. The method of claim 1 further comprising implanting dopants into said deposited semiconductor material.

4. The method of claim 1 wherein said semiconductor material is a silicon germanium alloy.

5. The method of claim 1 wherein said first pair of sidewall spacers have a width greater than said second pair of sidewall spacers.

6. The method of claim 1 further comprising:

after forming said second pair of sidewall spacers, and before depositing said semiconductor material, forming a pair of recesses on opposite sides of said gate electrode.

7. The method of claim 1 wherein said dopants are diffused utilizing a rapid thermal process.

8. A method of forming a transistor comprising:

forming a gate electrode on a gate dielectric layer on a first surface of a semiconductor substrate;

forming a first pair of sidewall spacers on opposite sides of said gate electrode;

implanting ions into said semiconductor substrate in adjacent to said first pair of sidewall spacers to form a pair of source/drain contact regions;

removing said first pair of sidewall spacers;

forming a second pair of sidewall spacers on opposite sides of said gate electrode, wherein said second pair of sidewall spacers have a width less than said first pair of sidewall spacers;

depositing semiconductor material onto said semiconductor substrate adjacent to said second pair of sidewall spacers;

implanting ions into said deposited semiconductor material wherein said ions are implanted with an energy sufficiently low to substantially confine said dopants within said semiconductor material; and annealing said substrate to diffuse said dopants from said deposited semiconductor material into said substrate beneath said gate electrode to form a pair of source/drain extensions.

9. The method of claim 8 wherein said semiconductor material is a silicon germanium alloy.

10. The method of claim 8 further comprising forming silicide on said semiconductor material.

11. The method of claim 8 further comprising forming a third pair of sidewall spacers adjacent to the outside edges of said second pair of sidewall spacers and on said deposited semiconductor material; and forming silicide on said deposited semiconductor material adjacent to the outside edges of said third pair of sidewall spacers.

12. The method of claim 8 where in said first pair of sidewall spacers have a width between 800–2,500 Å.

* * * * *